United States Patent [19]

Esrom

[11] Patent Number: 5,225,251
[45] Date of Patent: Jul. 6, 1993

[54] METHOD FOR FORMING LAYERS BY UV RADIATION OF ALUMINUM NITRIDE

[75] Inventor: Hilmar Esrom, Edingen-Neckarhausen, Fed. Rep. of Germany

[73] Assignee: ASEA Brown Boveri Aktiengesellschaft, Mannheim, Fed. Rep. of Germany

[21] Appl. No.: 944,036

[22] Filed: Sep. 11, 1992

Related U.S. Application Data

[63] Continuation of Ser. No. 748,515, Aug. 22, 1991, abandoned, Continuation of Ser. No. 2,270, Dec. 20, 1990.

[30] Foreign Application Priority Data

Dec. 22, 1989 [DE] Fed. Rep. of Germany .... 3942472.3

[51] Int. Cl.$^5$ .......................... B05D 3/06; C23C 2/04; C23C 16/06
[52] U.S. Cl. .................... 427/552; 427/553; 427/554; 427/555; 427/556; 427/558; 427/595; 427/250; 427/255; 427/227; 427/443.1; 205/182; 205/205
[58] Field of Search .............. 427/553, 554, 556, 557, 427/558, 595, 596, 597, 250, 443.1, 255, 227, 552; 205/183, 205

[56] References Cited

U.S. PATENT DOCUMENTS

| | | | |
|---|---|---|---|
| 4,509,451 | 4/1985 | Collins et al. | 427/596 |
| 4,663,826 | 5/1987 | Baeuerle | 427/526 |
| 4,668,304 | 5/1987 | Schachameyer et al. | 148/1.5 |
| 4,882,200 | 11/1989 | Liu et al. | 427/53.1 |
| 4,900,581 | 2/1990 | Stuke et al. | 427/554 |
| 4,987,008 | 1/1991 | Yamazaki et al. | 427/554 |

FOREIGN PATENT DOCUMENTS

0254111 1/1988 European Pat. Off. .
02254643 10/1990 Japan .

OTHER PUBLICATIONS

Bunshah, R. F., Deposition Technologies For Films & Coatings Noyes Publication Jan. 1982 pp. 6–7.
Hackh's Chemical Dictionary 4th ed. Jan. 1969.
Y. Murakami "Magnetooptic Storage Element" [60-247844 (A) Jap. Abstract].
H. Kawakami "Optical Recording Medium" [02-254643 (A) Jap. Abstract].

*Primary Examiner*—Shrive Beck
*Assistant Examiner*—Bret Chen
*Attorney, Agent, or Firm*—Herbert L. Lerner; Laurence A. Greenberg

[57] ABSTRACT

A process for forming layers on a substrate including irradiating at least part of an aluminum nitride surface with a high power ultraviolet emitter resulting in the elimination of the nitride component to form an aluminum layer. The aluminum layer is then reinforced by a metal.

2 Claims, 2 Drawing Sheets

FIG. 1
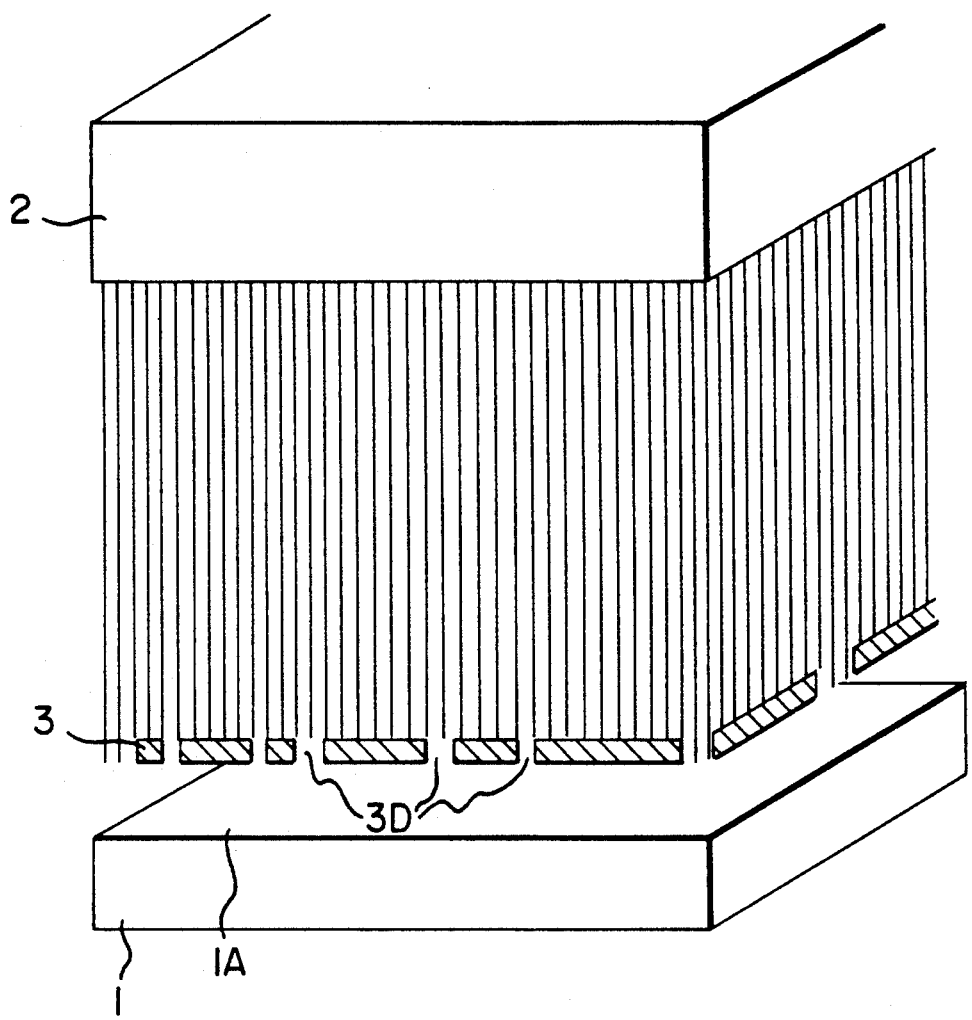
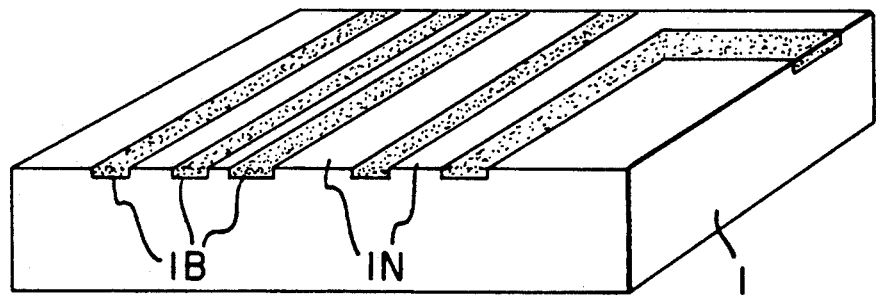
FIG. 2

METHOD FOR FORMING LAYERS BY UV RADIATION OF ALUMINUM NITRIDE

CROSS-REFERENCE TO RELATED APPLICATION

This application is a continuation of application Ser. No. 748,515, filed Aug. 22, 1991, now abandoned, which is a continuation of International Application PCT/EP 90/02270, filed Dec. 20, 1990.

The invention relates to a process for coating or forming layers on substrates.

Such processes are used wherever the surface of a substrate is to be partially or completely metallized, or provided with an alloy or a dielectric layer. However, such processes are relatively complicated.

It is accordingly an object of the invention to provide a coating process, which overcomes the hereinafore-mentioned disadvantages of the heretofore-known methods of this general type and with which metallizing and/or application of a layer to a substrate can be performed in a simple manner.

With the foregoing and other objects in view there is provided, in accordance with the invention, a process for forming layers on a substrate, which comprises irradiating regions partially or entirely covering a surface of a substrate or a layer being formed of a chemical compound, the chemical compound having at least one component which can be readily oxidized, nitrided or sublimated, and eliminating the at least one component and leaving only remaining components in the irradiated regions after irradiating.

In accordance with another mode of the invention, there is provided a process which comprises producing the substrate or layer by a process selected from the group consisting of sputtering, vapor deposition and CVD, and irradiated the surface with UV radiation having a wavelength substantially between 60 and 370 nm, in the irradiating step.

In accordance with a further mode of the invention, there is provided a process which comprises irradiating the substrate or layer with a high-power emitter as described in Published European Application No. 0 254 111 or with an excimer laser having a pulse rate of substantially from 100 to 200 Hz and a pulse energy of substantially from 100 to 200 mJ, in the irradiating step.

In accordance with an added mode of the invention, there is provided a process which comprises irradiating a substrate of aluminum nitride with a high-power emitter having a gas filling of krypton fluoride and emitting UV radiation in a range of substantially from 240 to 270 nm, in the irradiating step.

In accordance with an additional mode of the invention, there is provided a process which comprises irradiating a substrate or layer of a ceramic material with a high-power emitter emitting UV radiation in a wavelength range substantially between 60 nm and 320 nm, in the irradiating step.

In accordance with a concomitant mode of the invention, there is provided a process which comprises fabricating the substrate or layer from aluminum nitride, forming the surface regions of aluminum, and reinforcing the surface regions in a currentless metal bath with a process selected from the group consisting of CVD and electrolytic metallization with a layer of a material selected from the group consisting of copper, nickel, gold and zinc having a thickness of substantially up to 30 $\mu$m.

With the process according to the invention it is possible to partially or completely metallize the surface of the substrate, which is manufactured from aluminum nitride, for example, in a simple manner. The nitrogen in the irradiated region of the substrate surface can be liberated by irradiating the substrate surface with UV radiation of a defined wavelength and pulse rate. Once the irradiation has ended, the surface of the substrate in the irradiated regions will be formed of pure aluminum.

An alloy, a dielectric or a metal in the form of copper, nickel, gold, and so forth can then be applied to these regions in currentless wet-chemical metallizing baths. Furthermore, all of the surface regions that are formed by pure aluminum after the irradiation can be reinforced by other processes, for instance by a conventional thermal chemical vapor deposition or electrolytic metallizing process. As a result of irradiating a substrate of silicon nitride, the possibility also exists of liberating the nitrogen in the irradiated regions, so that the irradiated surface regions of the substrate are formed by pure silicon. The possibility also exists of irradiating ceramic substrates, prepared from chemical compounds that have at least one component that sublimates readily. The readily sublimating component is liberated by the irradiation, and the irradiated surface regions of the substrate are then formed by the components of the chemical compound that remain behind.

Other features which are considered as characteristic for the invention are set forth in the appended claims.

Although the invention is illustrated and described herein as embodied in a coated process, it is nevertheless not intended to be limited to the details shown, since various modifications may be made therein without departing from the spirit of the invention and within the scope and range of equivalents of the claims.

The method of operation of the invention, however, together with additional objects and advantages thereof will be best understood from the following description of specific embodiments when read in connection with the accompanying drawings.

BRIEF DESCRIPTION OF DRAWINGS

FIG. 1 is a fragmentary, diagrammatic, perspective view illustrating the treatment of a substrate surface by the process according to the invention;

FIG. 2 is a perspective view of an irradiated substrate;

Figure 3:
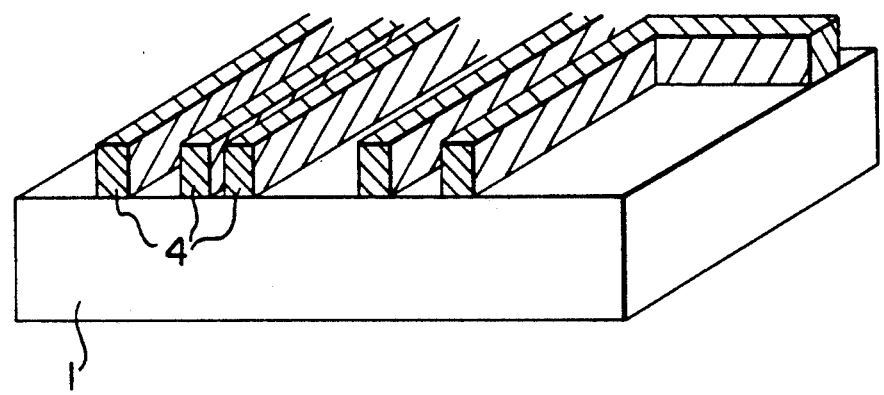
FIG. 3 is a fragmentary, perspective view of a coated substrate.

Referring now to the figures of the drawing in detail and first, particularly, to FIG. 1 thereof, there is seen a generally flat substrate 1, which is manufactured of aluminum nitride (AlN) in the exemplary embodiment shown herein. In order to form regions on a surface 1A of the substrate 1 that are formed by a pure metal, the substrate 1 is irradiated with UV radiation. A high-power UV emitter 2, in the form of an excimer laser or an excimer emitter is therefore disposed a defined distance above the substrate surface 1A. A detailed description of a high-powered emitter 2 of this kind can be found in Published European Application No. 0254 111.

The high-power emitter 2, which will be referred to below as an excimer emitter for short, is formed of a non-illustrated discharge chamber that is filled with a noble gas or gas mixture and is defined by non-illustrated metal electrodes that are cooled on one side and by a dielectric which is also not illustrated. The dielectric and a second electrode located on the surface of the dielectric remote from the discharge chamber are transparent to radiation generated by corona electrical discharge. A high-power UV emitter of high efficiency with a large surface area is created through the use of such a structure and a suitable selection of a filling gas. The high-power emitter 2 operates in a quasi-pulsed mode. In the exemplary embodiment shown herein, it is filled with krypton fluoride and can therefore produce UV radiation in the range from 240 to 270 nm. In order to produce UV radiation having a wavelength between 60 and 165 nm, a noble gas filling of helium or argon is used. With a xenon gas filling, a wavelength between 160 and 190 nm can be generated. With an argon fluoride gas filling, the wavelength is from 180 to 200 nm, while with a gas mixture of xenon and chlorine, a UV wavelength of from 300 to 320 nm can be attained. The excimer laser has a pulse rate of from 100 to 200 Hz, and the pulse energy is 100 to 200 mJ. With the gas mixtures Ar/F, Kr/F, XeCl, and Xe/F, corresponding wavelengths 193 nm, 248 nm, 308 nm and 351 nm can be generated.

If the entire surface of the substrate 1 is not to be irradiated, then a mask 3 is disposed between the surface 1A and the excimer laser 2. This mask has openings 3D formed therein. The openings 3D are disposed precisely where irradiation of the substrate surface 1 is desired. By irradiating the substrate surface 1, the nitrogen in the AlN compound is liberated. As a result, after the irradiation has ended, irradiated regions 1B are formed by pure aluminum, as seen in FIG. 2. Non-irradiated regions 1N of the substrate surface 1A continue to be formed of aluminum nitride. If the entire surface of the substrate is to have an aluminum coating, then the irradiation can be performed without the mask 3. The surface regions 1B that are formed by aluminum and shown in FIG. 2, can be used as catalysts, for instance, if the substrate 1 is further treated in currentless metallizing baths, so that a layer of copper, nickel, gold or zinc, for instance, can be applied to these regions 1B in a thickness of up to 30 μm. A substrate 1 provided with such layers 4 is shown in FIG. 3. As can be seen from FIG. 3, the regions 1N that are formed of aluminum nitride remain free of any coating.

According to the invention, the possibility also exists of reinforcing or coating the regions 1B by other processes. For instance, electrolytic metallizing can also be employed for coating or reinforcing. A current can also be passed continuously or in pulsed fashion through the regions 1B. In a CVD (chemical vapor deposition) reactor, a thermal CVD process can also be performed locally in this way. The regions 1B being formed of aluminum can be oxidized or nitrified locally as well. Through the use of a suitable disposition of the mask 3 between the substrate surface 1A and the excimer laser 2 and by purposefully irradiating the surface 1A, the regions 1B can be formed as conductor tracks for a circuit. Through the use of the local oxidation or nitriding of certain regions of these conductors tracks, the tracks can be provided with interruptions for carrying electrical signals at desired points. With the aid of the excimer laser 2, the aluminum nitride substrate 1 can also be drilled through. With the aid of focusing optical elements in the form of lenses and an XY displacing device, aluminum tracks can also be inscribed, in the course of which the AlN substrate is moved relative to the focusing beam of UV light.

Figure 4:
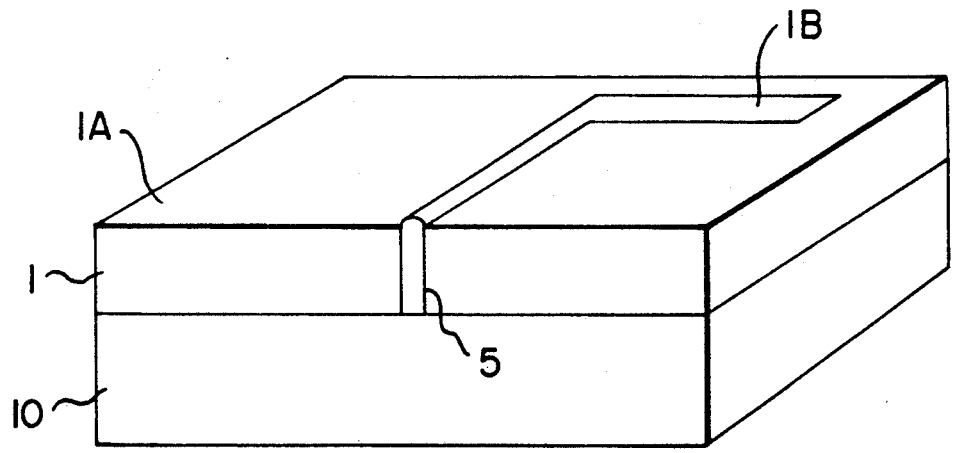
FIG. 4 is a perspective view of a substrate provided with bonding.

With the aid of a non-illustrated focusing optical element, the beam arriving from the excimer laser can be bunched in such a way that a bore 5 shown in FIG. 4 can be formed with the particular desired diameter. As already mentioned, the substrate 1 is fabricated completely of aluminum nitride. During the formation of the bore 5, the nitrogen present in the wall defining the bore 5 is liberated, so that the defining wall is formed exclusively of aluminum, after the bore 5 has been finished. If the bore 5 is in direct electrically conductive contact with the region 1B on the surface 1A on the substrate 1, then this region 1B is electrically conductively connected through the wall of the bore 5 with a layer 10 that is immediately adjacent the lower surface of the substrate 1.

The process according to the invention can not only be employed on substrates of aluminum nitride. There is also the possibility of irradiating substrates of silicon nitride ($Si_3N_4$) with the excimer laser. With this substrate as well, the nitrogen in the non-illustrated irradiated surface regions is again liberated. The possibility also exists of irradiating ceramic substrates that are formed of a chemical compound that has a readily sublimating component. The readily sublimating component is liberated by the irradiation. The irradiation surface regions of the substrate are then formed by the remaining components of the chemical compound. Since both the aluminum layers and the layers formed in the case of other substrates form an atomic bond with the layers located beneath them, a very high adhesion strength is effected thereby.

I claim:
1. A process for forming layers on a substrate, which comprises providing a substrate completely formed of aluminum nitride or having a layer of aluminum nitride disposed on its surface;
   irradiating at least part of a surface of the substrate or of the aluminum nitride layer with a high power emitter having a gas filling of krypton fluoride and emitting ultraviolet radiation in a range of substantially from 240 nm to 270 nm, resulting in the elimination of the nitride component from the aluminum nitride surface for forming an aluminum layer;
   reinforcing the remaining aluminum layer with a layer of a material selected from the group consisting of copper, gold, nickel and zinc having a thickness of not more than 30 μm with a process selected from the group consisting of electroless metal deposition, chemical vapor deposition and electrolytic metallization.
2. The method according to claim 1, which comprises irradiating with a high power emitter emitting incoherent radiation in the irradiating step.

* * * * *